(12) United States Patent
Kim et al.

(10) Patent No.: US 9,853,377 B2
(45) Date of Patent: Dec. 26, 2017

(54) CONNECTING MEMBER FOR ELECTRONIC DEVICE AND ELECTRONIC DEVICE INCLUDING THE SAME

(71) Applicant: Samsung Electronics Co., Ltd., Suwon-si, Gyeonggi-do (KR)

(72) Inventors: Yeon Woo Kim, Seoul (KR); Kyung Gu Kim, Hwaseong-si (KR); Gyu Sub Kim, Seoul (KR); Se Hyun Park, Suwon-si (KR); Jin Woo Jung, Seoul (KR); Jae Bong Chun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/037,612

(22) PCT Filed: Dec. 12, 2014

(86) PCT No.: PCT/KR2014/012262
§ 371 (c)(1),
(2) Date: May 18, 2016

(87) PCT Pub. No.: WO2015/088274
PCT Pub. Date: Jun. 18, 2015

(65) Prior Publication Data
US 2016/0294086 A1    Oct. 6, 2016

(30) Foreign Application Priority Data
Dec. 13, 2013 (KR) .................. 10-2013-0155911

(51) Int. Cl.
*H01R 12/00* (2006.01)
*H01R 12/70* (2011.01)
(Continued)

(52) U.S. Cl.
CPC .......... *H01R 12/7076* (2013.01); *H05K 1/02* (2013.01); *H05K 3/325* (2013.01);
(Continued)

(58) Field of Classification Search
CPC .................. H01R 12/57; H05K 3/4092; H01L 2924/01078; H01L 2924/01079; H01L 2924/14
(Continued)

(56) References Cited

U.S. PATENT DOCUMENTS 3,983,689 A * 10/1976 Burke .................... G04G 17/02
349/149
4,159,505 A * 6/1979 Carp .................... H05K 3/3405
361/752
(Continued)

FOREIGN PATENT DOCUMENTS

CN    1230807 A    10/1999
CN    201041855 Y    3/2008
(Continued)

*Primary Examiner* — Abdullah Riyami
*Assistant Examiner* — Vladimir Imas
(74) *Attorney, Agent, or Firm* — Jefferson IP Law, LLP

(57) ABSTRACT

A connecting member for electrically connecting a circuit board and a component in an electronic device is provided. The connecting member includes at least one bending part configured to comprise elasticity, a pad part connected to the bending part and configured to be attached to one surface of the circuit board, and a fixing part extending from the pad part and configured to fix the connecting member to the circuit board.

18 Claims, 10 Drawing Sheets

(51) Int. Cl.
*H05K 3/32* (2006.01)
*H05K 1/02* (2006.01)

(52) U.S. Cl.
CPC .............. *H05K 2201/09163* (2013.01); *H05K 2201/09209* (2013.01); *H05K 2201/10083* (2013.01); *H05K 2201/10098* (2013.01); *H05K 2201/10446* (2013.01)

(58) Field of Classification Search
USPC .................................................. 439/81, 862
See application file for complete search history.

(56) References Cited

U.S. PATENT DOCUMENTS

| | | | | |
|---|---|---|---|---|
| 4,380,359 A * | 4/1983 | Hoffman | ............ | H01R 12/7076 439/77 |
| 4,410,223 A * | 10/1983 | Baker | .................. | H05K 7/1069 439/329 |
| 4,646,395 A * | 3/1987 | Mayszak | ................ | B21D 53/36 24/135 R |
| 4,836,792 A * | 6/1989 | Glover | ...................... | H02K 5/00 439/81 |
| 4,875,863 A * | 10/1989 | Reed | .................... | H01R 12/714 439/676 |
| 4,954,090 A * | 9/1990 | Shimochi | ............. | H01R 9/2458 439/329 |
| 4,973,257 A * | 11/1990 | Lhotak | .................... | H01R 12/58 439/751 |
| 5,139,427 A * | 8/1992 | Boyd | .................... | H01R 12/714 439/247 |
| 5,513,996 A * | 5/1996 | Annerino | ............. | H01R 4/4809 439/95 |
| 5,664,973 A * | 9/1997 | Emmert | ................ | H02J 7/0045 320/115 |
| 6,198,444 B1 * | 3/2001 | Sailsman | ............... | H01Q 1/244 343/702 |
| 6,267,607 B1 * | 7/2001 | Fitch | ........................ | H01R 4/64 439/108 |
| 6,423,915 B1 * | 7/2002 | Winter | ................... | H01Q 1/243 200/292 |
| 6,433,956 B1 * | 8/2002 | Peters | ................ | G11B 33/122 360/99.25 |
| 6,568,943 B2 * | 5/2003 | Okayasu | ............. | H01R 13/112 439/636 |
| 6,807,067 B2 * | 10/2004 | Zhou | ................... | H04M 1/0262 361/754 |
| 6,837,724 B2 * | 1/2005 | McDaid | ................. | H01R 24/46 439/188 |
| 6,893,300 B2 * | 5/2005 | Zhou | .................... | H01R 13/052 439/862 |
| 7,001,190 B2 * | 2/2006 | Morana | ................ | H01R 13/112 439/81 |
| 7,131,170 B2 * | 11/2006 | Weaver | .................. | A46B 17/02 24/545 |
| 7,559,777 B2 * | 7/2009 | Lin | ...................... | H01Q 1/2258 439/108 |
| 7,598,924 B2 * | 10/2009 | Hynes | .................... | H01Q 1/243 343/702 |
| 7,651,381 B2 * | 1/2010 | Chuang | .................. | H01R 12/57 439/66 |
| 7,682,166 B2 * | 3/2010 | Chang | .................. | H01R 12/718 439/66 |
| D637,900 S * | 5/2011 | Paik | .............. | D8/395 |
| 7,989,045 B2 * | 8/2011 | Chang | ................. | H01R 12/57 174/366 |
| 8,052,428 B2 * | 11/2011 | Tsao | ..................... | H01R 4/4809 439/66 |
| 8,162,673 B2 * | 4/2012 | Chen | .................... | H05K 9/0064 439/66 |
| 8,221,143 B2 * | 7/2012 | Yu | ........................ | G06K 7/0021 439/159 |
| 8,298,021 B2 * | 10/2012 | Huang | ............... | H01R 13/2442 439/500 |
| 8,482,468 B2 * | 7/2013 | Park | ........................ | H01Q 1/12 343/702 |
| 8,517,777 B2 * | 8/2013 | Haans | ................ | H01R 12/57 439/816 |
| 8,526,170 B2 | 9/2013 | Nishikawa et al. | | |
| 8,784,146 B2 * | 7/2014 | Yang | ..................... | H01R 12/58 439/862 |
| 8,801,476 B2 * | 8/2014 | Zhang | ................ | H01R 13/26 439/668 |
| 8,821,198 B2 * | 9/2014 | Harada | .................. | H01R 12/57 439/66 |
| 8,851,907 B2 * | 10/2014 | Kim | .................. | H01R 12/7076 439/500 |
| D721,949 S * | 2/2015 | Kim | .............................. | D8/395 |
| 8,974,257 B1 * | 3/2015 | Xie | ........................ | H01R 12/57 439/862 |
| D775,666 S * | 1/2017 | Kim | .............................. | D14/492 |
| 2001/0005645 A1 * | 6/2001 | Zech | ...................... | H01R 24/46 439/188 |
| 2006/0105640 A1 | 5/2006 | Vance | | |
| 2006/0276085 A1 * | 12/2006 | Ma | ..................... | H01R 13/2464 439/862 |
| 2007/0059976 A1 * | 3/2007 | Yeh | ......................... | H01M 2/20 439/500 |
| 2008/0233810 A1 | 9/2008 | Chuang | | |
| 2009/0170378 A1 * | 7/2009 | Harada | .............. | H01R 13/2442 439/701 |
| 2011/0063186 A1 | 3/2011 | Park | | |
| 2011/0080696 A1 | 4/2011 | Nishikawa et al. | | |
| 2012/0003879 A1 | 1/2012 | Mason et al. | | |
| 2013/0059486 A1 | 3/2013 | Yang et al. | | |
| 2014/0045375 A1 * | 2/2014 | Eom | .................. | H01R 13/648 439/607.01 |
| 2014/0302730 A1 | 10/2014 | Yang et al. | | |
| 2015/0062847 A1 * | 3/2015 | Park | ........................ | H05K 3/32 361/760 |

FOREIGN PATENT DOCUMENTS

| | | |
|---|---|---|
| CN | 102545945 A | 7/2012 |
| CN | 202585847 U | 12/2012 |
| EP | 0610786 A2 | 8/1994 |
| JP | 6-152463 A | 5/1994 |
| JP | 2012-19497 A | 1/2012 |
| KR | 10-2008-0021280 A | 3/2008 |
| KR | 10-2010-0008332 A | 1/2010 |
| KR | 10-0989547 B1 | 10/2010 |
| KR | 10-2012-0017097 A | 2/2012 |

* cited by examiner (REALTED ART)

(REALTED ART)

(REALTED ART)

CONNECTING MEMBER FOR ELECTRONIC DEVICE AND ELECTRONIC DEVICE INCLUDING THE SAME

CROSS-REFERENCE TO RELATED APPLICATION(S)

This application is a U.S. National Stage application under 35 U.S.C. §371 of an International application filed on Dec. 12, 2014 and assigned application number PCT/KR2014/012262, which claimed the benefit of a Korean patent application filed on Dec. 13, 2013 in the Korean intellectual Property Office and assigned Serial number 10-2013-0155911, the entire disclosure of which is hereby incorporated by reference.

TECHNICAL

The present disclosure relates to a connecting member (for example, a contact clip and a C-clip) for connecting a circuit board, such as a printed circuit board (PCB), with an apparatus, a speaker, a receiver, and an antenna.

BACKGROUND

FIGS. 1A to 1C illustrate structures of a connecting member used in a general portable electronic device according to the related art.

Referring to FIG. 1A, a connecting member is arranged on a circuit board disposed on an x-y plane. For example, if a device (not shown) such as an antenna is connected to a circuit board by using a connecting member such as that shown in FIG. 1A, the z-axis direction thickness of an electronic device is increased inevitably.

FIG. 1B illustrates a C-clip installed at an opening part formed in a circuit board to reduce the z-axis direction thickness of an electronic device. If an antenna and a circuit board are connected through such a connecting member, the z-axis direction thickness of an electronic device may be reduced relatively compared to the example of FIG. 1C illustrates a connecting member connected in a direction (for example, an x-y plane direction) vertical to the z-axis. In such a way, an additional support or flexible printed circuit board (FPCB) for side surface contact may be used or a screw may be applied to the side of an apparatus.

Connecting members as those shown in FIGS. 1A and 1B are designed to contact the z-axis by using a circuit board as a support. Additionally, as shown in FIG. 1C, in order to use the contact at a side surface, a configuration of an additional apparatus and/or FPCB is required or a complex apparatus structure for fixing a connecting member by using a screw at the apparatus is required.

However, an internal mounting space of a portable electronic device may have limitations due to a screen display unit that gradually becomes larger for a larger display and a large battery for a longer operating time, Accordingly, there are many difficulties in applying a side surface connecting method with an additional apparatus structure.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a connecting member for connecting a circuit board.

In accordance with an aspect of the present disclosure, a connecting member for electrically connecting a circuit board and a component in an electronic device is provided. The connecting member includes at least one elastic bending part, a pad part connected to the bending part and configured to be attached to one surface of the circuit board, and a fixing part extending from the pad part and configured to fix the connecting member to the circuit board.

In accordance with another aspect of the present disclosure, an electronic device for wireless communication is provided. The electronic device includes a processor, an antenna element, a circuit board, and a connecting member configured to electrically connect the antenna element and the circuit board. The connecting member includes a pad part connected to a side surface of the circuit board, a fixing part connected to one of a front surface and a rear surface of the circuit board, and a bending part connected to the antenna element.

In accordance with another aspect of the present disclosure, a connecting member is provided. The connecting member includes a pad part extending along a first plane and configured to contact a first surface of a substrate, at least one elastic bending part extending along a second plane substantially parallel to the first plane and connected with the pad part, and at least one fixing part extending along a third plane substantially perpendicular to the first and second planes, the at least one fixing part being connected with the pad part and configured to be fixedly attached to a second surface of the substrate.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
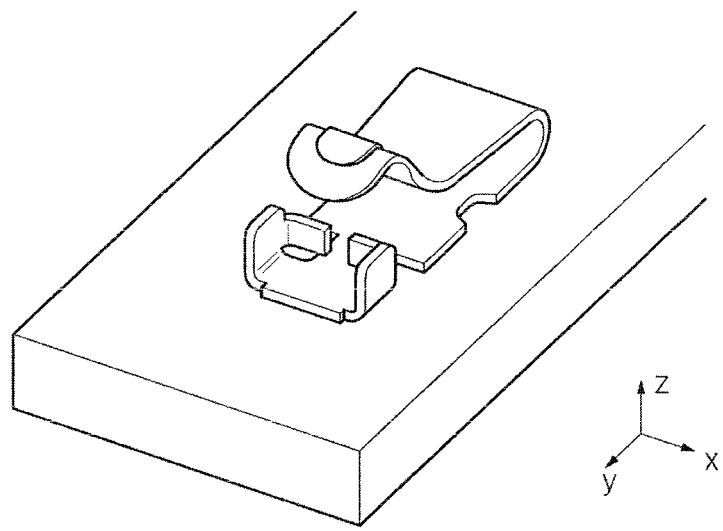
FIGS. 1A to 1C illustrate structures of a connecting member used in a general portable electronic device according to the related art.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The term "include," "comprise," and "have", or "may include," or "may comprise" and "may have" used herein indicates disclosed functions, operations, or existence of elements but does not exclude other functions, operations or elements. Additionally, in various embodiments of the present disclosure, the term "include," "comprise," "including," or "comprising," specifies a property, a region, a fixed number, a process, an element and/or a component hut does not exclude other properties, regions, fixed numbers, processes, elements and/or components.

In various embodiments of the present disclosure, expression "A or B" or "at least one of A and/or B" may include all possible combinations of items listed together. For instance, the expression "A or B", or "at least one of A and/or B" may indicate include A, B, or both A and B.

The terms such as "1st", "2nd", "first", "second", and the like used herein may refer to modifying various different elements of various embodiments of the present disclosure, but do not limit the elements. For instance, such expressions do not limit the order and/or importance of corresponding components. The expressions may be used to distinguish one element from another element. For instance, both "a first user device" and "a second user device" indicate a user device and indicate different user devices from each other. For example, a first component may be referred to as a second component and vice versa without departing from the scope of the present disclosure.

In this disclosure below, when one part (or element, device, etc.) is referred to as being "connected" to another part (or element, device, etc.), it should be understood that the former can be "directly connected" to the latter, or "connected" to the latter via an intervening part (or element, device, etc.). In contrast, when an element is referred to as being "directly connected" or "directly coupled" to another element, there are no intervening elements present.

Unless otherwise indicated herein, all the terms used herein, which include technical or scientific terms, may have the same meaning that is generally understood by a person skilled in the art. In general, the terms defined in the dictionary should be considered to have the same meaning as the contextual meaning of the related art, and, unless clearly defined herein, should not be understood abnormally or as having an excessively formal meaning.

Hereinafter, an electronic device according to various embodiments of the present disclosure will be described in more detail with reference to the accompanying drawings.

Figure 2A:
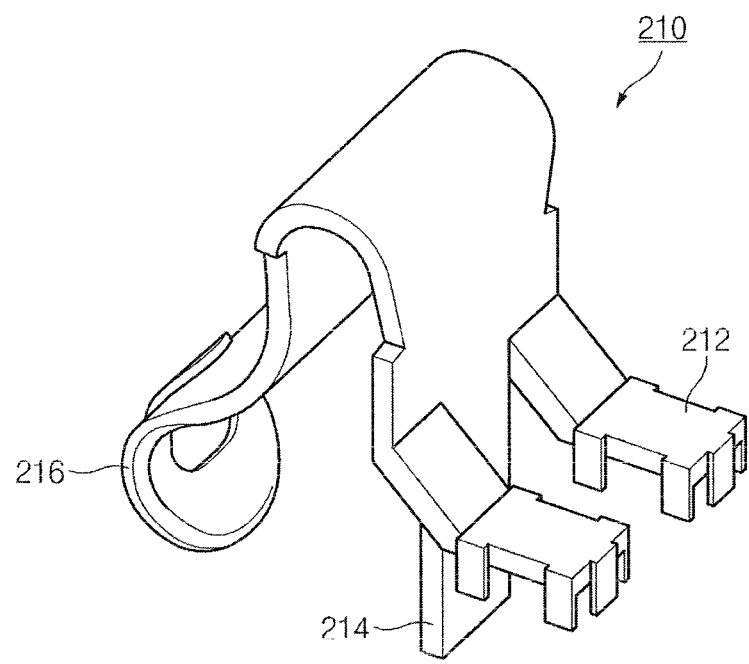
FIG. 2A is a view illustrating a vertical connecting member according to an embodiment of the present disclosure.

FIG. 2A is a view illustrating a vertical connecting member according to an embodiment of the present disclosure.

Referring to FIG. 2A, a connecting member 210 may include a fixing part (e.g., fixing part 212), a pad part 214, and a bending part 216. The connecting member 210 may be formed of a conducting metallic material in order to provide an electrical contact between a component and a circuit board. For example, the connecting member 210 may include a material such as beryllium, titanium, steel use stainless (SUS), and German silver. Additionally, at least a portion of the surface of the connecting member 210 may be plated with, for example, at least one of silver (Au) and nickel (Ni).

The fixing part 212 of the connecting member 210 may comprise a structure configured to fix the connecting member 210 to a circuit board, For example, the fixing part 212 may have a concave-convex ( ) structure. By connecting the fixing part 212 of such a structure to a printed circuit board (PCB), even if the connecting member 210 is connected to the side surface of a substrate, a fixing state may be maintained.

The pad part 214 may be implemented with a dip type. If a component contacts a C-clip connected to a side surface of a substrate, force may be applied in an x-axis or y-axis direction with respect to an x-y plane where a substrate is disposed and thus, a soldering part may be torn apart. However, by implementing the pad part 214 with a dip type, a fixing release phenomenon when a component contacts the connecting member 210 may be prevented.

The bending part 216 may physically contact a component, such as an antenna, and electrically connect a component and a circuit board through the pad part 214 that extends from the bending part 216 and is connected to the circuit board.

When assembled, in relation to the connecting member 210, the pad part 214 having a dip-type form is attached to the side surface of the circuit board. The fixing part 212, which may be configured in the shape of a foot, may be attached to the front surface and/or rear surface of the circuit board. Through such a structure, the connecting member 210 may be attached to the side surface of the circuit board to allow a component that physically contacts the bending part 216 to be electrically connected to the circuit board. Through this, it is possible to implement a contact through the side surface part of a substrate without an additional apparatus configuration. The connecting member 210 may be applied to a side surface antenna contact, a side surface apparatus contact, and a side surface component contact. The side surface contact may have a mounting structure advantageous for a slimming portable electronic device.

Figure 2B:
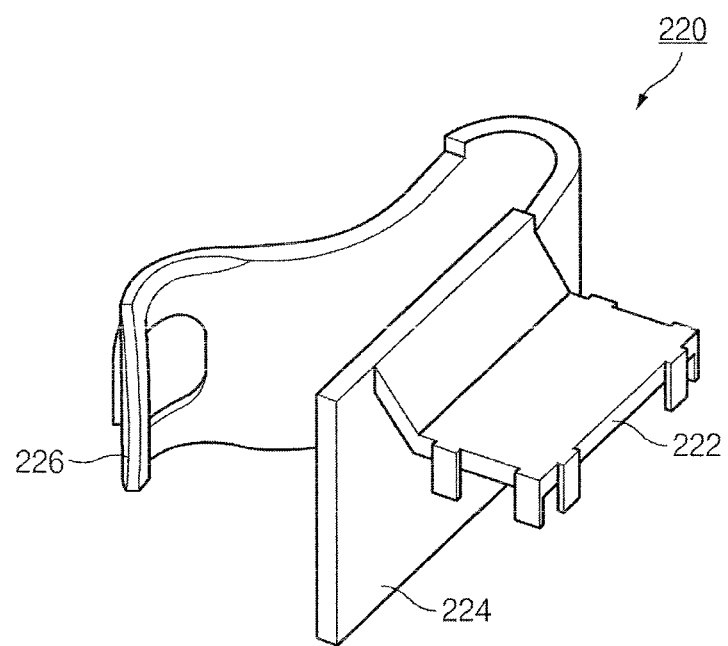
FIG. 2B is a view illustrating a horizontal connecting member according to an embodiment of the present disclosure.

FIG. 2B is a view illustrating a horizontal connecting member according to an embodiment of the present disclosure. It is understood that connecting member 220, fixing part 222, pad part 224, and bending part 226 in FIG. 2B correspond to the connecting member 210, the fixing part 212, the pad part 214, and the bending part 216 in FIG. 2A, respectively.

However, in the embodiment shown in FIG. 2A, the bending part 216 is arranged in a vertical direction with respect to a circuit board but in the embodiment shown in FIG. 2B, the bending part 226 is arranged in a horizontal direction with respect to a circuit board. Herein, when it is assumed that the front or rear surface of a circuit board is disposed on the x-y plane, the vertical direction refers to the z-axis direction and the horizontal direction refers to the x or y axis, In FIG. 2A, the tip direction of the bending part 216 points to the z-axis and in FIG. 2B, the tip direction of the bending part 226 points to the x or y axis.

Figure 3A:
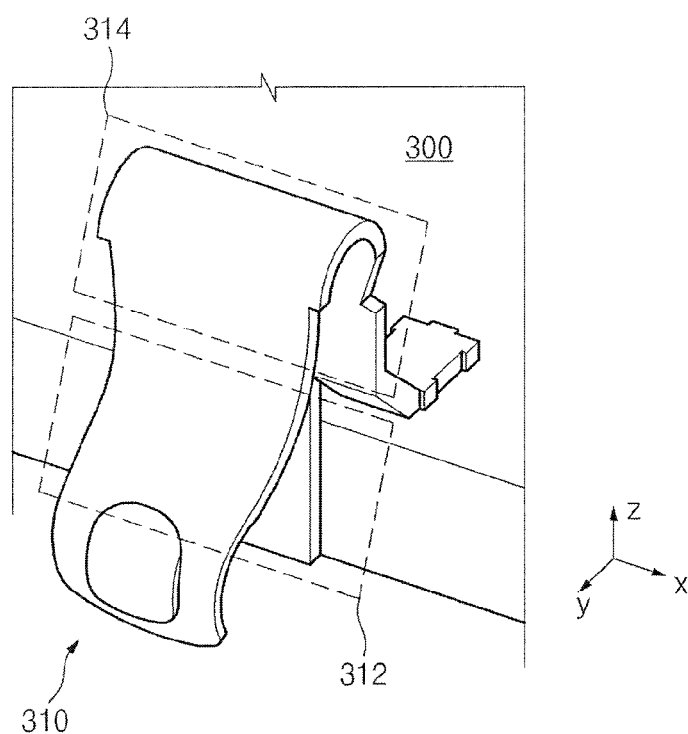
FIG. 3A is a view illustrating a connecting member that is vertically connected to a circuit board according to an embodiment of the present disclosure.

FIG. 3A is a view illustrating a connecting member that is vertically connected to a circuit board according to an embodiment of the present disclosure.

Referring to FIG. 3A, a connecting member 310 is coupled to a portion of the side surface of a substrate 300, Additionally, a fixing part of the connecting member 310 may be coupled to the front surface of the substrate 300. In a modified embodiment, the fixing part of the connecting member 310 may be coupled to the rear surface of a substrate. As at least two different surfaces of the substrate 100 are coupled to the connecting member 310, in such a manner, even if the connecting member 310 is disposed at the side surface of the substrate 300, it is possible to obtain the durability and/or tension (or elasticity) that is equivalent to that of a case that a connecting member such as a C-clip is disposed in a z-axis direction according to the related art.

A structure corresponding to a first area 312 in the connecting member 310 shown in FIG. 3A during side surface contact may be configured to maintain equivalent durability in comparison to z-axis contact. That is, a pad part of the connecting member 310 is coupled to the side surface of the substrate in a dip type, and pressure is generated in the inner side surface direction of the substrate by a component connected to a bending part of the connecting member 310. The pressure in such a form may correspond to pressure generated at the plane of a circuit board by a component during z-axis contact, which is identical to a case that a C-clip is disposed on a plane (for example, the x-y plane) of a circuit board. Accordingly, the connecting member 310 may use the side surface of a circuit board as the support of the connecting member 310 and accordingly, maintain the durability equivalent to that of a general z-axis contact.

A structure corresponding to a second area 314 in the connecting member 310 shown in FIG. 3A is disposed in the z-axis direction with respect to the substrate 300. Due to the structure corresponding to the second area 314, the pressure delivered to a fixing part of the connecting member 310 connected to the substrate 300 may allow the fixing part and the substrate 300 to be coupled to each other well. When the connecting member 310 receives force on its side surface, due to such a structure, it has sufficient restoring force and is not pushed away by a force received in the x-axis or y-axis direction.

Figure 3B:
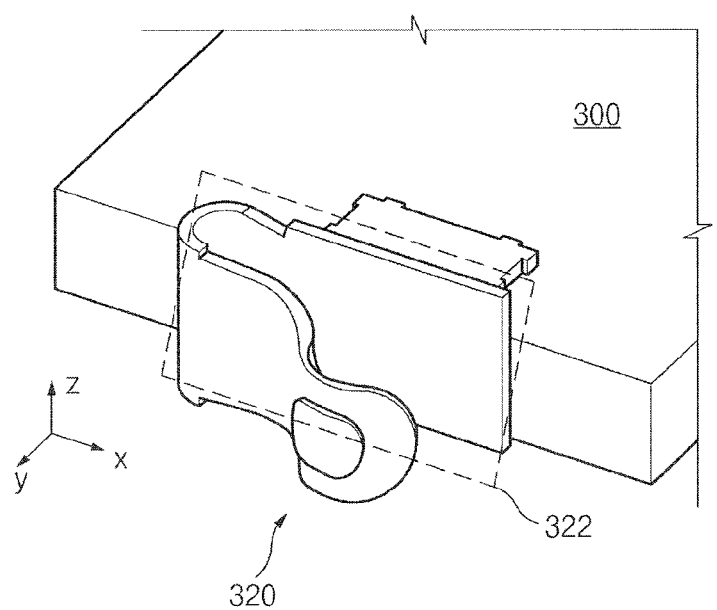
FIG. 3B is a view illustrating a connecting member that is horizontally connected to a circuit board according to an embodiment of the present disclosure.

FIG. 3B is a view illustrating a connecting member that is horizontally connected to a circuit board according to an embodiment of the present disclosure.

Referring to FIG. 3B, connecting member 320 is coupled to a portion of a side surface of substrate 300. Additionally, a fixing part of the connecting member 320 is coupled to the front surface of the substrate 300. in a modified embodiment, the fixing part of the connecting member 320 may be coupled to the rear surface of a substrate. As at least two different surfaces of the substrate 100 are coupled to the connecting member 320 in such a manner, even if the connecting member 320 is disposed at the side surface of the substrate 300, it is possible to obtain the durability or tension that is equivalent to or relatively greater than that of a case that a connecting member such as a C-clip is disposed in a z-axis direction according to the related art.

A structure corresponding to a first area 322 in the connecting member 320 shown in FIG. 313 during side surface contact may he configured to maintain equivalent durability in comparison to z-axis contact. Description relating to this overlaps or corresponds to the content described above in relation to FIG. 3A and thus is omitted for brevity.

Figure 4A:
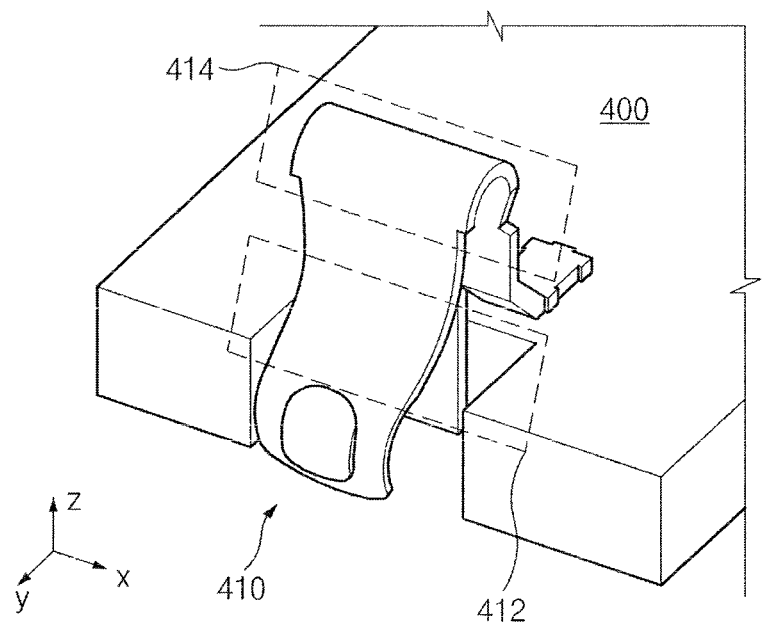
FIG. 4A is a view illustrating a connecting member that is vertically connected to an engraving-processed circuit board according to an embodiment of the present disclosure.

FIG. 4A is a view illustrating a connecting member that is vertically connected to an engraving-processed circuit board according to an embodiment of the present disclosure.

Figure 1B:
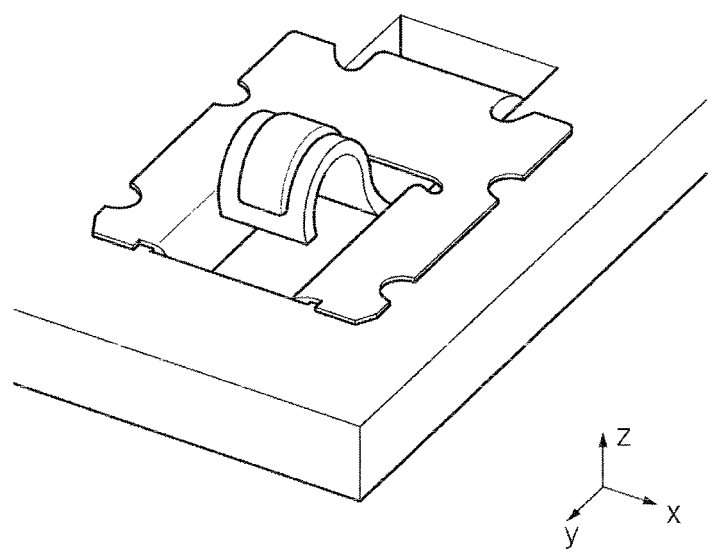
Figure 1C:
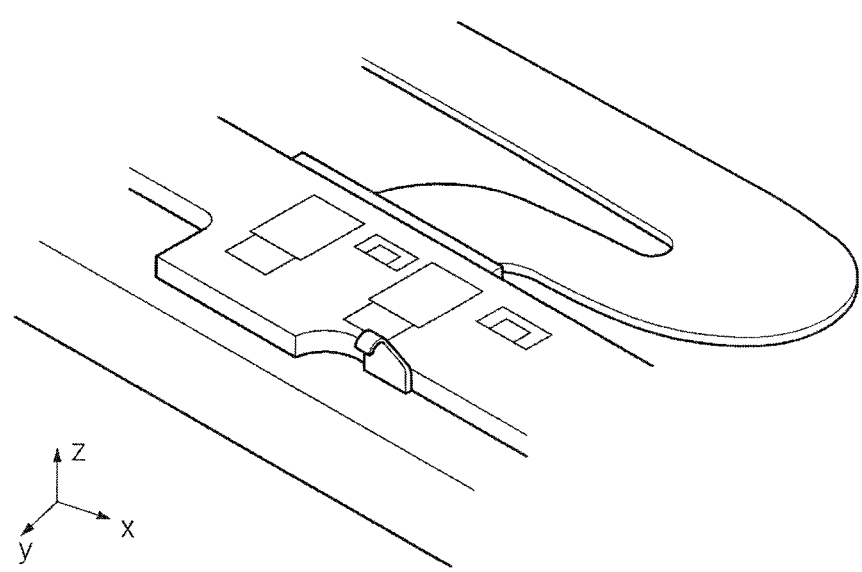

The circuit board may be mounted in an electronic device and include a circuit necessary for supplying power to an internal component or operating various types of modules. Additionally, the circuit board may include some engraved (cut out) components or an opening part in an appropriate form. Furthermore, the opening part may be formed in the circuit board. Although an embodiment in which a connecting member is arranged at an engraved surface is shown in FIG. 4A, a connecting member may be arranged in an opening part formed in a circuit board. Unlike that shown in FIG. 1B, according to an embodiment of the present disclosure, a connecting member may be attached to a portion of the side surface of an opening part. Additionally, the opening part may have various polygonal forms or closed curve forms in addition to a simple rectangular or circular form.

As an example of such a circuit board, FIG. 4A illustrates a substrate 400 comprising a circuit board (not shown) where a portion of the circuit board disposed on an x-y plane is engraved inwardly. As connecting member 410 is disposed in such an engraved area, it is possible to reduce drawbacks due to the impact or bending of a connecting member disposed outside a substrate. Furthermore, by efficiently using the mounting space of an electronic device including a circuit board, a connecting member, and a component connected to the connecting member, the size of a bezel or an appearance of a device may be reduced. A first area 412 and a second area 414 shown in FIG. 4A correspond to the first area 312 and the second area 314 shown in FIG. 3A, respectively, and thus, their descriptions are omitted for brevity.

Figure 4B:
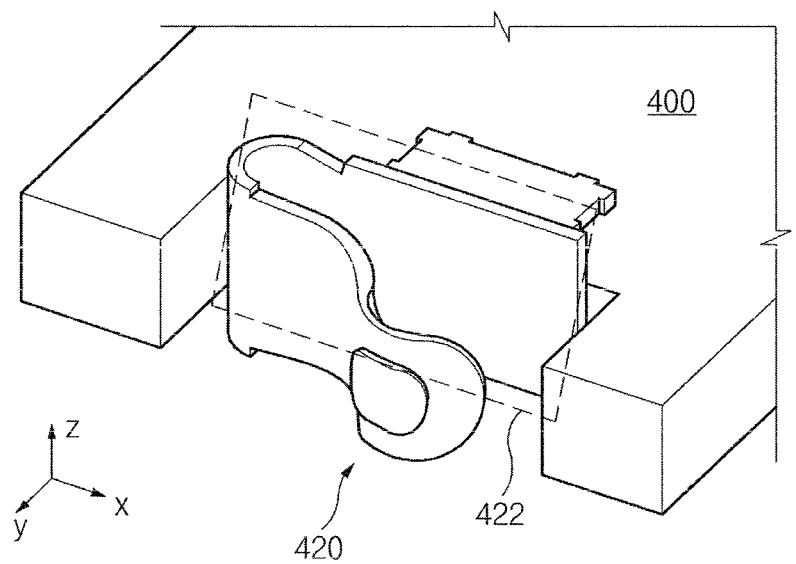
FIG. 4B is a view illustrating a connecting member that is vertically connected to an engraving-processed circuit board according to an embodiment of the present disclosure.

FIG. 4B is a view illustrating a connecting member that is horizontally connected to an engraving-processed circuit board according to an embodiment of the present disclosure.

Like the connecting member 410 shown in FIG. 4A, as connecting member 420 is disposed in such an engraved area of the substrate 400, it is possible to reduce drawbacks due to the impact or bending of a connecting member disposed outside a substrate. Description for the first area 422 shown in FIG. 4B may correspond to the first area 322 shown in FIG. 3B.

Although it is described with reference to FIGS. 4A and 4B that a portion of a side surface disposed at the perimeter of the substrate 400 comprising a circuit board is engraved, the connecting member 410 or 420 may be attached to an opening part formed in the substrate 400 comprising a circuit board or an engraved area with respect to a vertical direction (that is, the z-axis direction) of a substrate plane. That is, a pad part of the connecting member 410 or 420 may be coupled to a portion of a side surface of an opening part formed in a substrate. Additionally, a fixing part of the connecting member 410 or 420 may be coupled to the front or rear surface of a substrate different from the side surface of an opening part. Through such a structure, the substrate 400 comprising the circuit board and the connecting member 410 or 420 may configure side surface contact in an inner area of a substrate.

Figure 5A:
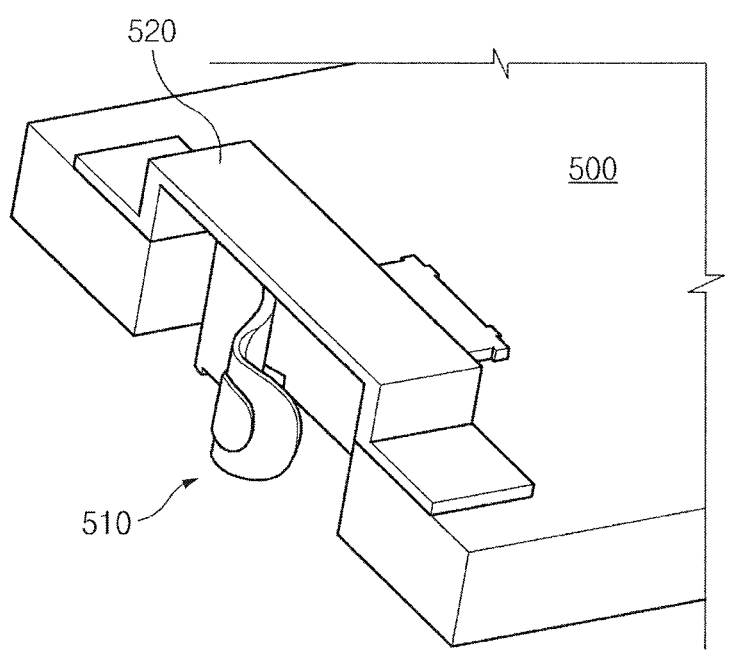
FIG. 5A is a view illustrating a structure for protecting a connecting member according to an embodiment of the present disclosure.

FIG. 5A is a view illustrating a structure for protecting a connecting member according to an embodiment of the present disclosure.

In general, a circuit board such as a PCB may be very thin and the thickness of a connecting member such as a C-clip may be thicker than the circuit board, so that when a substrate and a connecting member are connected, a portion of the connecting member may protrude outwardly (that is, protrude toward the z-axis on the same plane as the substrate). Various components and modules such as an antenna, a receiver, and a microphone sensor are mounted in an electronic device and if necessary, drawbacks, such as impact or bending on a component/circuit board, may occur. Alternatively, a structure in which a connecting member protrudes may be vulnerable to an external impact applied to an electronic device. Accordingly, as shown in FIG. 5A, for a connecting member 510 coupled to a side surface of a substrate 500, a protection part 520 attached to the front and/or rear surface of the substrate 500, which is different from amide surface of the substrate 500 where the connecting member 510 is coupled, may be arranged. Additionally, the protection part 520 may be separated from an area corresponding to the connecting member 510 or a pad part of the connecting member 510 and protect the connecting member 510 from impact or pressure applied in the z-axis direction with respect to the connecting member 510 connected to the side surface of the substrate 500.

Figure 5B:
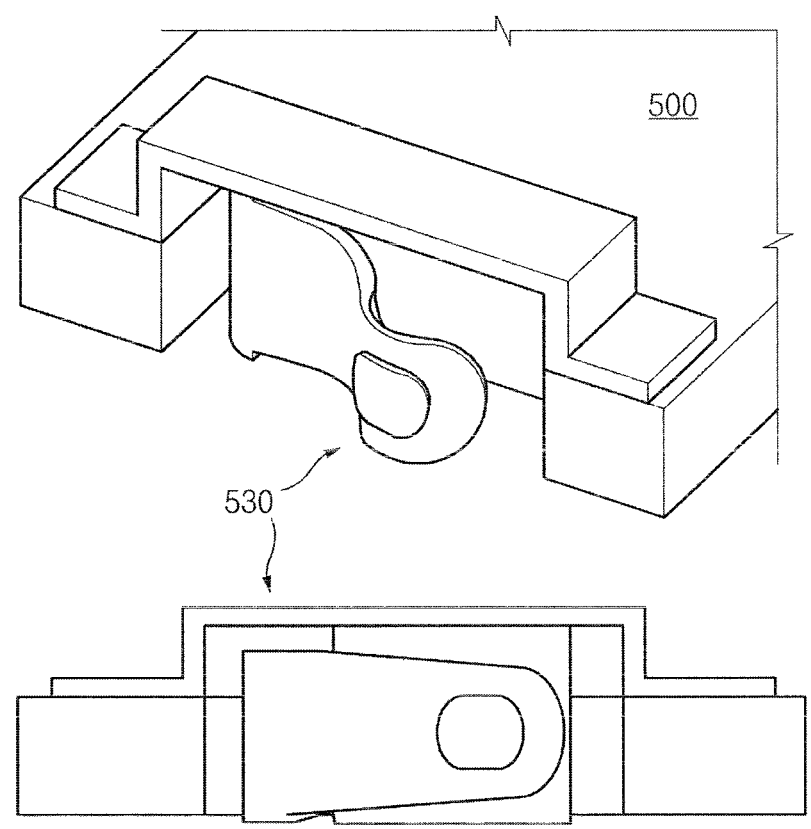
FIG. 5B is a view illustrating a connecting member connected to a protection part according to an embodiment of the present disclosure.

FIG. 5B is a view illustrating a connecting member connected to a protection part according to an embodiment of the present disclosure. Unlike the example shown in FIG. 5A, the protection part of FIG. 58 extends from a side surface of a pad part of a connecting member 530 and is coupled to a surface (that is, the front or rear surface of the substrate 500), which is different from a surface where the pad part contacts the substrate 500, thereby protecting the connecting member 530.

A protection part, as shown in FIG. 5B, may be understood as a modified embodiment of the fixing part described with reference to FIGS. 2A and 2B. Referring to FIG. 2B, the connecting member 220 includes the fixing part 222 extending from the pad part 224. In comparison to FIG. 2B, referring to FIG. 5B, a connecting member includes an additional fixing part extending from a pad part in a different direction from the fixing part 222, and the additional fixing part is coupled to another portion of a substrate to perform a role for protecting the connecting member. At least one fixing part extending in the above method may be configured to comprise one of a 'ㄱ' and 'ㄷ' form. Of course, various embodiments of the present disclosure are not limited to the above-mentioned form.

Figure 6:
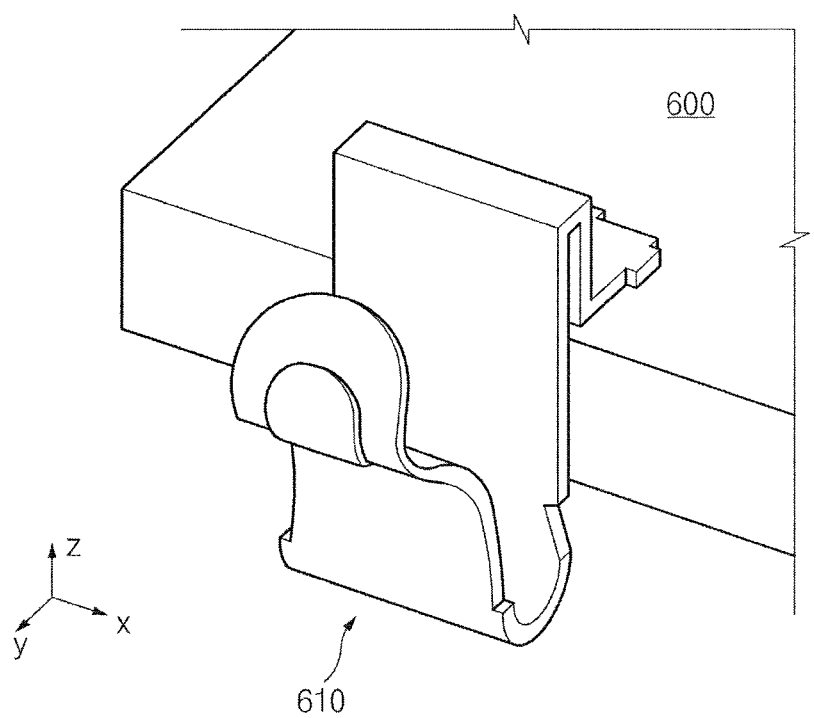
FIG. 6 is a view illustrating a vertical reverse connecting member according to an embodiment of the present disclosure.

FIG. 6 is a view illustrating a vertical reverse connecting member according to an embodiment of the present disclosure.

Referring to FIG. 6, a connecting member 610 is attached to a side surface of a substrate 600. However, compared to the connecting member 310 shown in FIG. 3A, the direction of a bending part faces the opposite direction (that is, the z-direction). In order to configure such reverse contact, the connecting member 610 may include a bending part arranged in a reverse direction, a pad part extending from the bending part and a portion of which is coupled to a side surface of the substrate 600, and a fixing part bent from one end of the pad part to be coupled to the front surface of the substrate 600.

Figure 7:
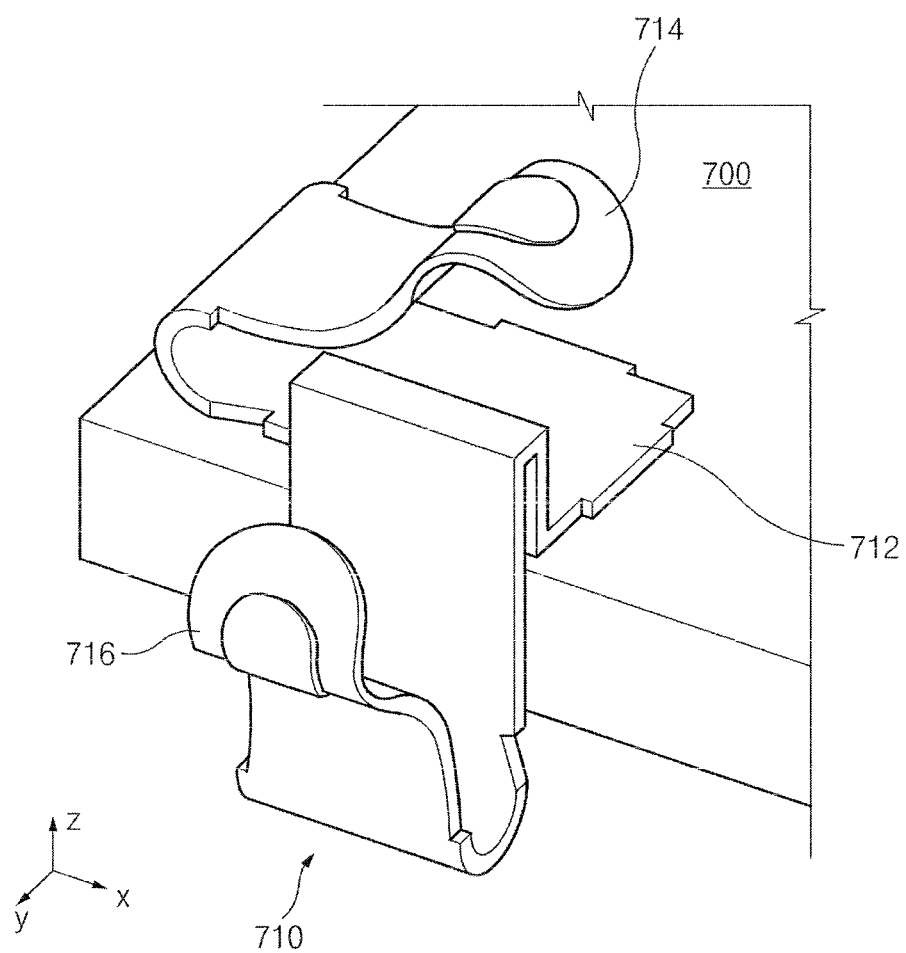
FIG. 7 is a view illustrating a two-way connecting member according to an embodiment of the present disclosure.

FIG. 7 is a view illustrating a two-way connecting member according to an embodiment of the present disclosure.

Referring to FIG. 7, a connecting member 710 may include the vertical reverse connecting member shown in FIG. 6 and also include an additional bending part 714 arranged in another direction (that is, a contact point faces the z-axis direction). That is, the connecting member 710 may configure a contact point with an arbitrary component at a side surface of a substrate 700 by a basic bending part 716, and configure a contact point with an arbitrary component at the upper part of the substrate by the additional bending part 714. At this point, fixing part 712 may correspond to a pad part extending from the additional part 714.

In the embodiment shown in FIG. 7, the additional bending part 714 is shown in a form of extending from a vertical reverse connecting member, such as that shown in FIG. 6, hut other forms are possible. For example, although not shown in the drawings, another form of a connecting member may include an additional bending part that extends from a fixing part of the vertical connecting member shown in FIG. 3A or 4A and has a contact point in the z-axis direction. Another form of a connecting member may include an additional bending part that extends from a fixing part of the horizontal connecting member shown in FIG. 3B or 4B and has a contact point in the z-axis direction, Additionally, the connecting member may include at least one additional bending part. For example, in relation to the connecting member shown in FIG. 3B or 4B, a connecting member including a fixing part extending from a pad part to the front or rear surface of a substrate and an additional bending part having a contact point in the z-axis and z-axis directions connected to the fixing part may be considered.

Figure 8:
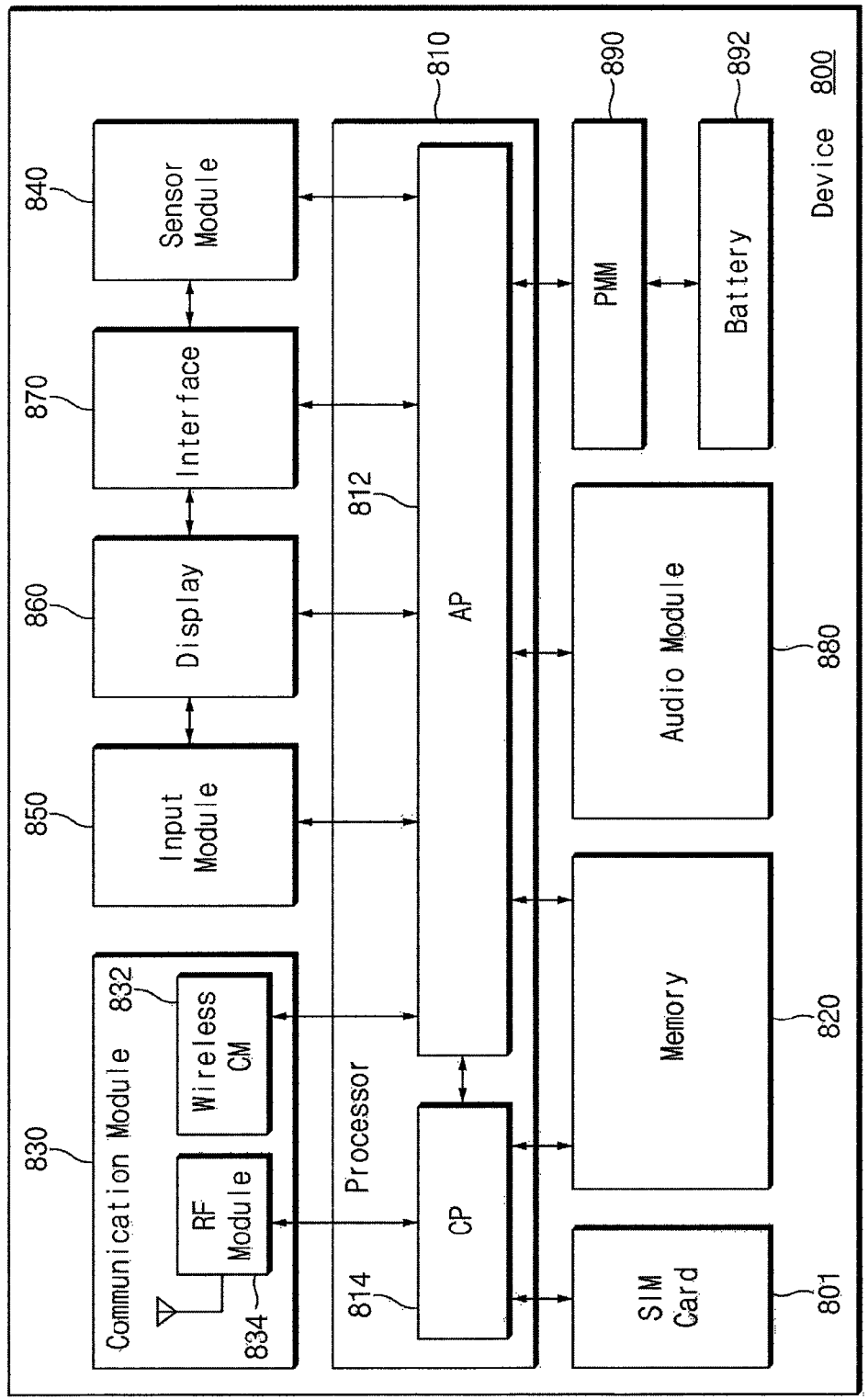
FIG. 8 is a view illustrating an exemplary structure of an electronic device including a connecting member according to an embodiment of the present disclosure.

FIG. 8 is a view illustrating a structure of an electronic device including a connecting member according to an embodiment of the present disclosure.

Referring to FIG. 8, an electronic device 800 may include a processor 810, a memory 820, a communication module 830, a sensor module 840, an input module 850, a display 860, an interface 870, an audio module 880, a power management module (PMM) 890, a battery 892, and a subscriber identification module (SIM) card 801.

The processor 810 may include at least one application processor (AP) 812 and/or at least one communication processor (CP) 814. Although it is shown in FIG. 8 that the AP 812 and the CP 814 are included in the processor 810, the AP 812 and the CP 814 may be included in different integrated circuit (IC) packages, respectively. According to an embodiment of the present disclosure, the AP 812 and the CP 814 may be included in one IC package.

The SEM card 801 may be a card including a SIM and may be inserted into a slot formed at a specific position of an electronic device. The SIM card 801 may include unique identification information (for example, an IC card identifier (ICCID)) or subscriber information (for example, an international mobile subscriber identity (IMSI)).

The memory 820 may include an internal memory or an external memory. The internal memory may include at least one of volatile memories such as dynamic random access memory (DRAM), static RAM (SRAM), and synchronous DRAM (SDRAM) and non-volatile memories such as one time programmable read only memory (OTPROM), PROM, erasable PROM (EPROM), electrically erasable PROM (EEPROM), mask ROM, flash ROM, NAND flash memory, and NOR flash memory. According to an embodiment of the present disclosure, the internal memory may be solid state drive (SSD). The external memory may further include one of a flash drive such as compact flash (CF) card, a secure digital (SD) card, a micro-SD card, a mini-SD card, an extreme digital (xD) card, and a memory stick. The external memory may be functionally connected to the electronic device 800 through various interfaces. According to an embodiment of the present disclosure, the electronic device 800 may further include a storage device (or a storage medium) such as hard disk drive (HDD).

The communication module 830 may include a wireless communication module (wireless CM) 832 and/or a radio frequency (RF) module 834. The wireless CM 832, for example, may include Wi-Fi, Bluetooth, global positioning system (GPS), or near field communication (NFC). The wireless CM 832 may provide a wireless communication function by using wireless frequency.

The RF module 834 may be responsible for data communication such as the transmission/reception of an RF signal. The RF module 834, for example, may include one of a transceiver, a power amp module (PAM), a frequency filter, and a low noise amplifier (LNA). Additionally, the RF module 834 may further include components for transmitting/receiving electromagnetic waves on a free space in a wireless communication, for example, conductors or conducting wires. According to an embodiment, an antenna system may correspond to the RF module 834 or at least one part configuring the RF module 834.

The sensor module 840 measures physical quantities or detects an operating state of the electronic device 800, thereby converting the measured or detected information into electrical signals. The sensor module 840 may include at least one of a gesture sensor, a gyro sensor, a barometric pressure sensor, a magnetic sensor, an acceleration sensor, a grip sensor, a proximity sensor, a color sensor (for example, a red, green, blue (RGB) sensor), a biometric sensor, a temperature/humidity sensor, an illumination sensor, and an ultra violet (UV) sensor. The sensor module 840 may further include a control circuit for controlling at least one sensor.

The input module 850 may include a touch panel, a (digital) pen sensor, a key, or an ultrasonic input device. The touch panel, for example, may recognize a touch input through at least one of capacitive, resistive, infrared, and ultrasonic methods.

The display 860 may include a panel, a hologram, or a projector 866. For example, the panel may be one of a liquid crystal display (LCD) and an active matrix organic light emitting diode (AM-OLED). Additionally, the panel may be implemented to be at least one of flexible, transparent, and wearable.

The interface 870 may include one of a high definition multimedia interface (HUM), a universal serial bus (USB), an optical communication terminal, and a D-subminiature (D-sub) terminal. Additionally, the interface 870 may include one of a mobile high-definition link MHO, an SD card/multi-media card (MMC), and an infrared data association (IrDA).

The audio module 880 may convert sound into electrical signals and convert electrical signals into sounds. The audio module 880 may process sound information inputted/outputted through one of a speaker, a receiver, an earphone, and a microphone.

The PMM 890 may manage the power of the electronic device 800. The PMM 890 may include one of a power management IC (PMIC), a charger IC, and a battery gauge or fuel gauge.

In general, various connecting members according to an embodiment of the present disclosure may be electrically connected to an antenna or the RF module 834. That is, a connecting member may establish connection between the RF module 834 or the communication module 830 including the same and the processor 810 connected through a circuit board. However, the present disclosure is not limited to such an embodiment and a connecting member may establish electrical connection between various components, an apparatus, a sensor, a module, and the processor 810. For example, a connecting member may connect the SIM card 801, the audio module 880, various sensor modules 84, and the processor 810 through a circuit board.

According to various embodiments of the present disclosure, a connecting member may be stably disposed at a side surface part of a circuit board in the inner space of an electronic device, Side surface contact provided through the connecting member may be applied to an antenna, an apparatus, and a component.

Various embodiments of the present disclosure have advantages in a structure for mounting a component at the inside of a portable electronic device such that the structure allows the portable electronic device to become slimmer. Especially, when an electronic device uses a metallic outer (or housing) and metal is disposed at its side surface, without an additional apparatus configuration, antenna connection to the side surface becomes possible immediately, so that there are advantages in an antenna assembly structure.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A connecting member for electrically connecting a circuit board and a component in an electronic device, the connecting member comprising:
   at least one elastic bending part;
   a pad part connected to the bending part and configured to be attached to one surface of the circuit board; and
   a fixing part extending from the pad part and configured to fix the connecting member to another surface of the circuit board,
   wherein the pad part is attached to a portion of a side edge of an opening part arranged inside a perimeter of the circuit board.

2. The connecting member of claim 1, wherein the fixing part is attached to a surface different from the one surface of the circuit board.

3. The connecting member of claim 1, wherein the one surface of the circuit board where the pad part is attached comprises a side edge of the circuit board.

4. The connecting member of claim 1, wherein the bending part is configured to physically contact the component.

5. The connecting member of claim 4, wherein the component comprises an antenna mounted on the electronic device.

6. The connecting member of claim 1, wherein the bending part is disposed in one of a horizontal and vertical direction with respect to the circuit board.

7. The connecting member of claim 1, wherein the pad part is attached to a portion of a side edge disposed at a perimeter of the circuit board.

8. The connecting member of claim 1, further comprising a protection part extending from a side surface of the pad part and being connected to a surface different from the one surface of the circuit board.

9. The connecting member of claim 1, further comprising a protection part that is separated from a side surface of the pad part and connected to a surface different from the one surface of the circuit board.

10. The connecting member of claim 1, wherein the pad part is implemented in a dip type.

11. The connecting member of claim 1,
wherein the fixing part comprises a plurality of convex structures, and
wherein the plurality of convex structures is coupled to the circuit board.

12. The connecting member of claim 1,
wherein the fixing part is configured to comprise one of an 'L' shape form or a 'U' shape form, and
wherein the one of the 'L' shape form or the 'U' shape form is configured to contact at least one surface of the circuit board in order to fix the connecting member to the circuit board.

13. The connecting member of claim 1,
wherein the fixing part is connected to an elastic additional bending part, and
wherein the additional bending part is oriented in a different direction from the bending part.

14. An electronic device for wireless communication, the electronic device comprising:
a processor;
an antenna element;
a circuit board; and
a connecting member configured to electrically connect the antenna element and the circuit board,
wherein the connecting member comprises:
a pad part connected to a side edge of the circuit board,
a fixing part connected to one of a front surface and a rear surface of the circuit board, and
a bending part connected to the antenna element, and
wherein the pad part is attached to a portion of a side edge of an opening part arranged inside a perimeter of the circuit board.

15. A connecting member comprising:
a pad part extending along a first plane and configured to contact a first surface of a substrate;
at least one elastic bending part extending along a second plane substantially parallel to the first plane and connected with the pad part;
at least one fixing part extending along a third plane substantially perpendicular to the first and second planes, the at least one fixing part being connected with the pad part and configured to be fixedly attached to a second surface of the substrate; and
a protection part configured to be attached to a first portion of the second surface of the substrate at a first end and attached to a second portion of the second surface of the substrate at a second end,
wherein the protection member is further configured to protect the connecting member from an impact and a pressure being applied to the connecting member.

16. The connecting member of claim 15, wherein the pad part is configured to comprise a dip-type form.

17. The connecting member of claim 15, wherein the at least one elastic bending part is configured to:
physically contact at least one electrical component of a mobile device, and
electrically connect the at least one electrical component to a circuit board of the substrate through the pad part.

18. The connecting member of claim 17, wherein the pad part is further configured to be connected to the circuit board.

* * * * *